(12) United States Patent
Park et al.

(10) Patent No.: US 9,824,920 B2
(45) Date of Patent: Nov. 21, 2017

(54) METHODS OF FORMING SELF-ALIGNED CONTACT STRUCTURES BY WORK FUNCTION MATERIAL LAYER RECESSING AND THE RESULTING DEVICES

(71) Applicant: GLOBALFOUNDRIES Inc., Grand Cayman (KY)

(72) Inventors: Chanro Park, Clifton Park, NY (US); Ruilong Xie, Niskayuna, NY (US); Hoon Kim, Clifton Park, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/089,834

(22) Filed: Apr. 4, 2016

(65) Prior Publication Data
US 2017/0287780 A1   Oct. 5, 2017

(51) Int. Cl.
| | |
|---|---|
| H01L 21/768 | (2006.01) |
| H01L 21/8238 | (2006.01) |
| H01L 21/28 | (2006.01) |
| H01L 29/66 | (2006.01) |
| H01L 27/092 | (2006.01) |
| H01L 29/49 | (2006.01) |
| H01L 23/535 | (2006.01) |

(52) U.S. Cl.
CPC .. *H01L 21/76897* (2013.01); *H01L 21/28088* (2013.01); *H01L 21/76805* (2013.01); *H01L 21/823821* (2013.01); *H01L 21/823842* (2013.01); *H01L 21/823871* (2013.01); *H01L 23/535* (2013.01); *H01L 27/0924* (2013.01); *H01L 29/4966* (2013.01); *H01L 29/66545* (2013.01)

(58) Field of Classification Search
CPC ......... H01L 29/66545; H01L 27/11582; H01L 29/66795; H01L 21/76897; H01L 21/76805
See application file for complete search history.

(56) References Cited

U.S. PATENT DOCUMENTS

| | | | |
|---|---|---|---|
| 8,536,040 B1* | 9/2013 | Park | H01L 29/49 257/E21.198 |
| 2011/0156107 A1* | 6/2011 | Bohr | H01L 21/76831 257/288 |
| 2014/0008720 A1* | 1/2014 | Xie | H01L 27/092 257/331 |

(Continued)

*Primary Examiner* — Marcos D Pizarro
*Assistant Examiner* — Shannon Yi
(74) *Attorney, Agent, or Firm* — Amerson Law Firm, PLLC

(57) ABSTRACT

One method disclosed includes, among other things, forming a first plurality of gate cavities in a first dielectric layer. A work function material layer is formed in the first plurality of gate cavities. A first conductive material is formed in at least a subset of the first plurality of gate cavities above the work function material layer to define a first plurality of gate structures. A first contact recess is formed in the first dielectric layer between two of the first plurality of gate structures. A second conductive material is formed in the first contact recess. The work function material layer is recessed selectively to the first and second conductive materials to define a plurality of cap recesses. A cap layer is formed in the plurality of cap recesses.

18 Claims, 20 Drawing Sheets

(56) References Cited

U.S. PATENT DOCUMENTS

| | | | |
|---|---|---|---|
| 2015/0041905 A1* | 2/2015 | Xie | H01L 29/6656 257/369 |
| 2015/0170966 A1* | 6/2015 | Tung | H01L 21/76816 438/618 |
| 2016/0005658 A1* | 1/2016 | Lin | H01L 21/823456 257/392 |
| 2016/0181383 A1* | 6/2016 | Huang | H01L 29/41758 257/757 |

* cited by examiner

US 9,824,920 B2

1

METHODS OF FORMING SELF-ALIGNED CONTACT STRUCTURES BY WORK FUNCTION MATERIAL LAYER RECESSING AND THE RESULTING DEVICES

BACKGROUND OF THE INVENTION

1. Field of the Invention

The present disclosure generally relates to the fabrication of integrated circuits, and, more particularly, to various methods of forming self-aligned contact (SAC) structures by work function material layer recessing and the resulting semiconductor devices.

2. Description of the Related Art

In modern integrated circuit products, such as microprocessors, storage devices and the like, a very large number of circuit elements, especially transistors, are formed on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (ON-state) and a high impedance state (OFF-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises a doped source region and a separate doped drain region that are formed in a semiconductor substrate. The source and drain regions are separated by a channel region. A gate insulation layer is positioned above the channel region and a conductive gate electrode is positioned above the gate insulation layer. The gate insulation layer and the gate electrode may sometimes be referred to as the gate structure of the device. By applying an appropriate voltage to the gate electrode, the channel region becomes conductive and current is allowed to flow from the source region to the drain region. The gate structures for such planar FET devices may be manufactured using so-called "gate-first" or "replacement gate" (gate-last) manufacturing techniques.

Typically, due to the large number of circuit elements, e.g., transistors, and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements, i.e., the transistors, with the metallization layers, an appropriate vertical contact structure to the transistor device is formed, wherein a first end of the vertical contact structure is connected to a respective contact region of a circuit element, such as a gate electrode and/or the drain and source regions of transistors, and a second end that is connected to a respective metal line in the metallization layer by a conductive via. As device dimensions have decreased, and packing densities have increased, the physical space between adjacent gate structures is so small that it is very difficult to accurately position, align and form a contact opening in a layer of insulating material using traditional masking and etching techniques. Accordingly, contact-formation technologies have been developed in which contact openings are formed in a self-aligned manner by removing dielectric material, such as silicon dioxide, selectively from the spaces between closely spaced gate electrode structures. That is, after completing the transistor structures, the gate cap layer and the sidewall spacers of adjacent gate structures are effectively used as etch masks for selectively removing the silicon dioxide material in order to expose the source/drain regions of the transistors, thereby providing self-aligned trenches which are substantially laterally defined by the spacer structures positioned adjacent the gate structures.

However, the aforementioned process of forming self-aligned contacts results in an undesirable loss of the materials that protect the conductive gate electrode, i.e., the gate cap layer and the sidewall spacers, as will be explained with reference to FIGS. 1A-1B. FIG. 1A schematically illustrates a cross-sectional view of an integrated circuit product 100 at an advanced manufacturing stage. As illustrated, the product 100 comprises a plurality of illustrative gate structures 105 that are formed above a substrate 110, such as a silicon substrate. The gate structures 105 are comprised of an illustrative gate insulation layer 115 and an illustrative gate electrode 120 that are formed in a gate cavity 125 using a gate-last processing technique, an illustrative gate cap layer 130 and sidewall spacers 135. The gate cap layer 130 and sidewall spacers 135 encapsulate and protect the gate electrode 120 and the gate insulation layer 115. Also depicted in FIG. 1A are a plurality of raised source/drain regions 140 and a layer of insulating material 145, e.g., silicon dioxide.

FIG. 1B depicts the product 100 after a contact etching process was performed to form a contact opening 150 in the layer of insulating material 145 for a self-aligned contact. Although the contact etch process performed to form the opening 150 is primarily directed at removing the desired portions of the layer of insulating material 145, portions of the protective gate cap layer 130 and the protective sidewall spacers 135 are consumed during the contact etch process, as simplistically depicted in the dashed-line regions 155. Typically, when the layer of insulating material 145 is made of silicon dioxide, and the spacers 135 and gate cap layer 130 are made of silicon nitride, the contact etching process may be a dry, anisotropic (directional) plasma etching process that is intended to selectively remove the silicon dioxide layer 145 relative to the silicon nitride spacers 135/gate cap layer 130 of the gate structure 105. As device dimensions continue to shrink, the process margin for such a dry etching process is reduced. For example, if sufficient thickness of the spacers 135 is lost during the contact etching process, then the resulting device 100 may not be acceptable in that many device specifications specify that, after the contact etching process is performed, the final spacer must have a minimum thickness or width. If the gate electrode 120 is exposed, a contact-to-gate short will be introduced, resulting in a defective device 100.

The problems associated with the erosion of the gate cap layer 130 and the spacers 135 may be exacerbated by variations in the height of the gate electrode 120 and the thickness of the cap layer 130. Different transistors on the same product may have different gate lengths. In addition, the gate profile (i.e., top CD versus bottom CD) may vary due to process variations. The gate length and profile affect the aspect ratio of the gate cavity. In turn, the aspect ratio affects the replacement gate metal deposition and subsequent timed recess etch that makes room for the gate cap layer. As a result of these sources of variation, not all of the gate electrodes 120 may have the same height and not all of the gate cap layers 130 may have the same thickness.

The present disclosure is directed to various methods of forming contact structures on semiconductor devices and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contact (SAC) structures by work function material layer recessing and the resulting semiconductor devices. One method disclosed includes, among other things, forming a first plurality of gate cavities in a first dielectric layer. A work function material layer is formed in the first plurality of gate cavities. A first conductive material is formed in at least a subset of the first plurality of gate cavities above the work function material layer to define a first plurality of gate structures. A first contact recess is formed in the first dielectric layer between two of the first plurality of gate structures. A second conductive material is formed in the first contact recess. The work function material layer is recessed selectively to the first and second conductive materials to define a plurality of cap recesses. A cap layer is formed in the plurality of cap recesses.

Another method disclosed includes, among other things, forming a plurality of placeholder gate structures including a first placeholder gate structure having a first width, and a second placeholder gate structure having a second width less than the first width. Spacers are formed adjacent the plurality of placeholder gate structures. A first dielectric layer is formed above the plurality of placeholder gate structures. The first dielectric layer is planarized to expose the plurality of placeholder gate structures. The first and second placeholder gate structures are removed to define a plurality of gate cavities including a first gate cavity defined by removing the first placeholder gate structure and a second gate cavity defined by removing the second placeholder gate structure. A work function material layer is formed in the plurality of gate cavities. The work function material layer substantially fills the second gate cavity to define a first gate structure. A first conductive material is formed in the first gate cavity above the work function material layer to substantially fill the first gate cavity to define a second gate structure. A first contact recess is formed in the first dielectric layer between the first and second gate structures. A second conductive material is formed in the first contact recess. The work function material layer in the first and second gate structures is recessed selectively to the first and second conductive materials to define a plurality of cap recesses in the first and second gate structures. A cap layer is formed in the plurality of cap recesses.

BRIEF DESCRIPTION OF THE DRAWINGS

The disclosure may be understood by reference to the following description taken in conjunction with the accompanying drawings, in which like reference numerals identify like elements, and in which.

Figures 1A, 1B:
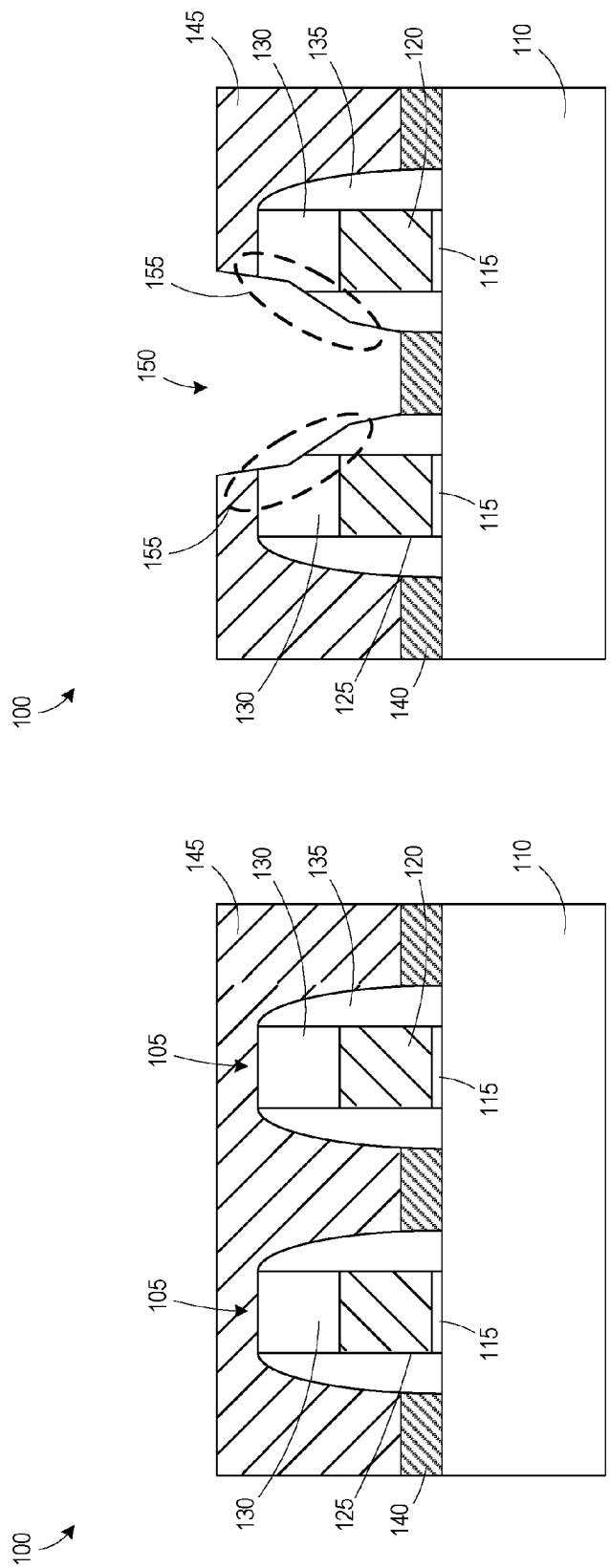
FIGS. 1A-1B depict one illustrative prior art method of forming self-aligned contacts and some of the problems that may be encountered using such prior art processing techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned contact (SAC) structures by work function material layer recessing and the resulting semiconductor devices. Moreover, as will be readily apparent to those skilled in the art upon a complete reading of the present application, the present method is applicable to a variety of devices, including, but not limited to, planar transistor devices, FinFET devices, nanowire devices, and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different products, e.g., memory products, logic products, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

Figure 2A:
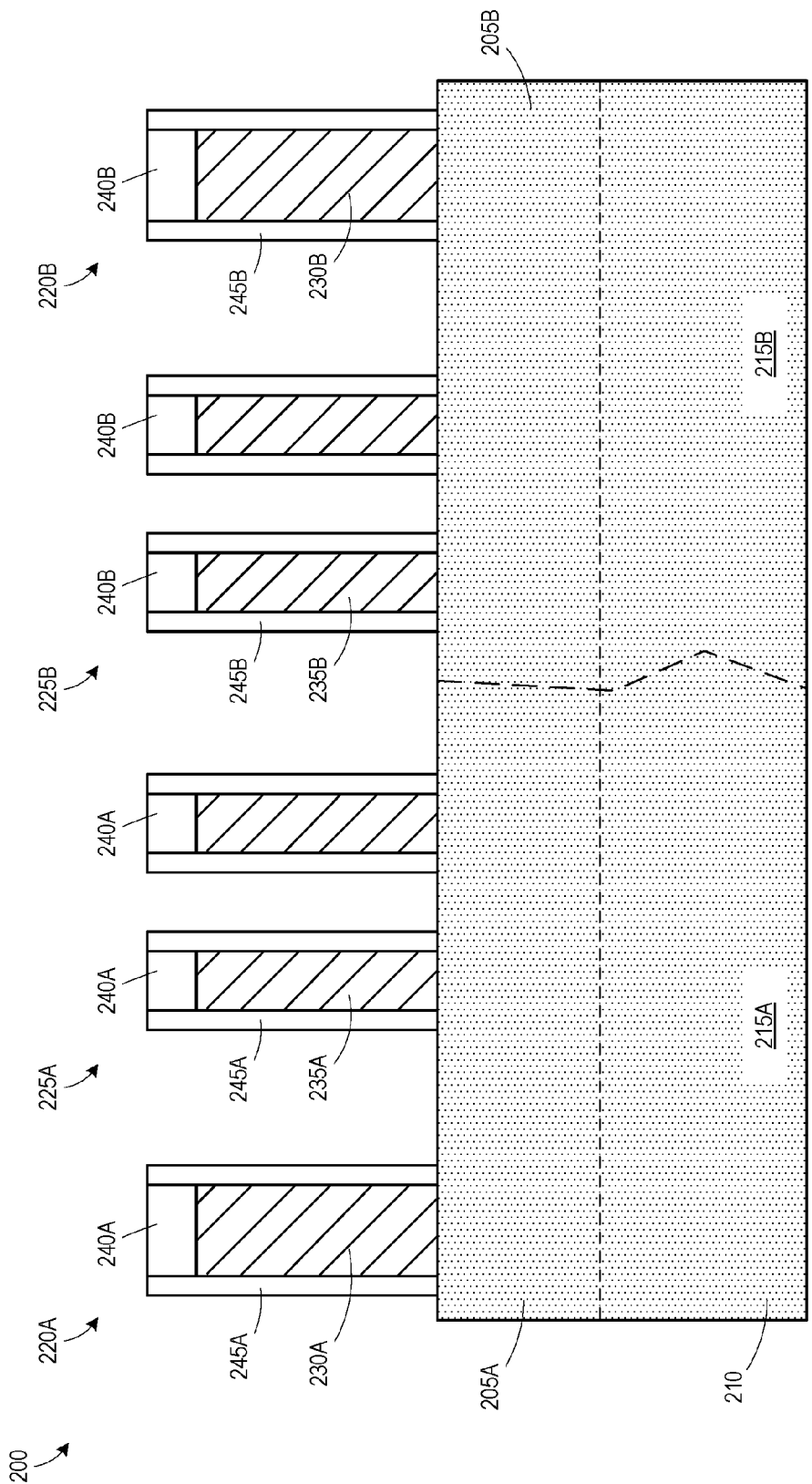
FIGS. 2A-2P depict various illustrative methods disclosed for forming self-aligned contact (SAC) structures by work function material layer recessing and the resulting semiconductor devices.
Figure 2B:
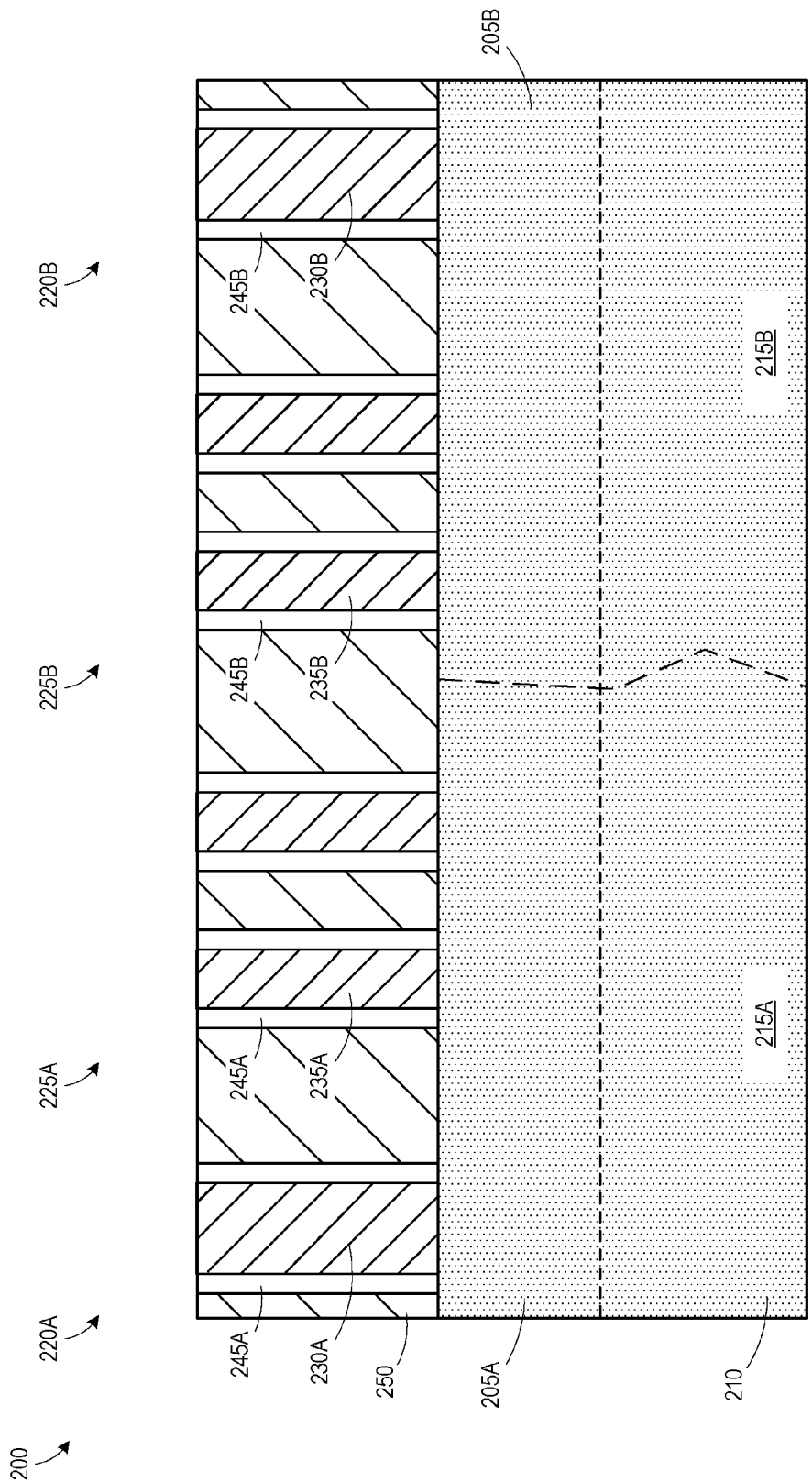
Figure 2C:
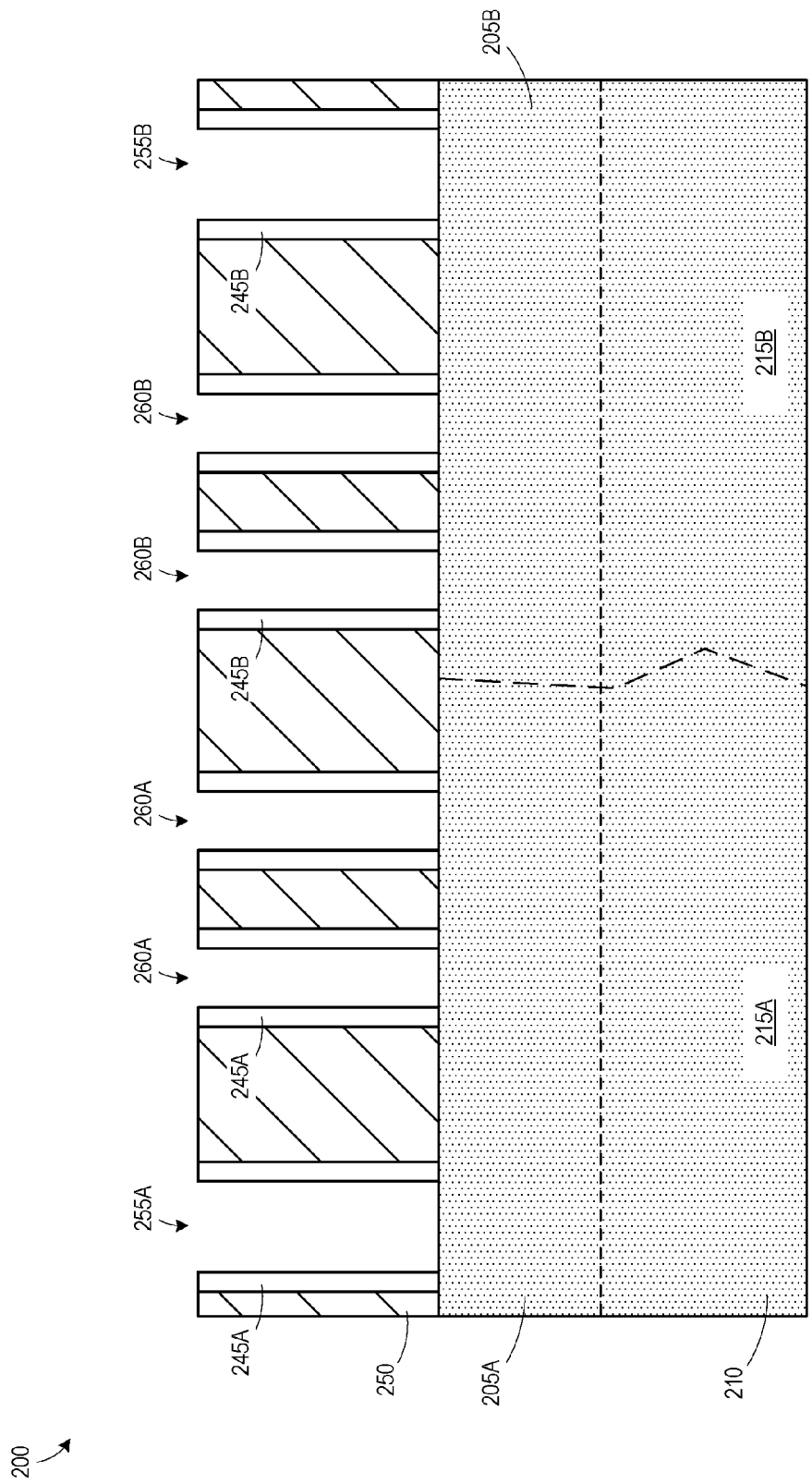
Figure 2D:
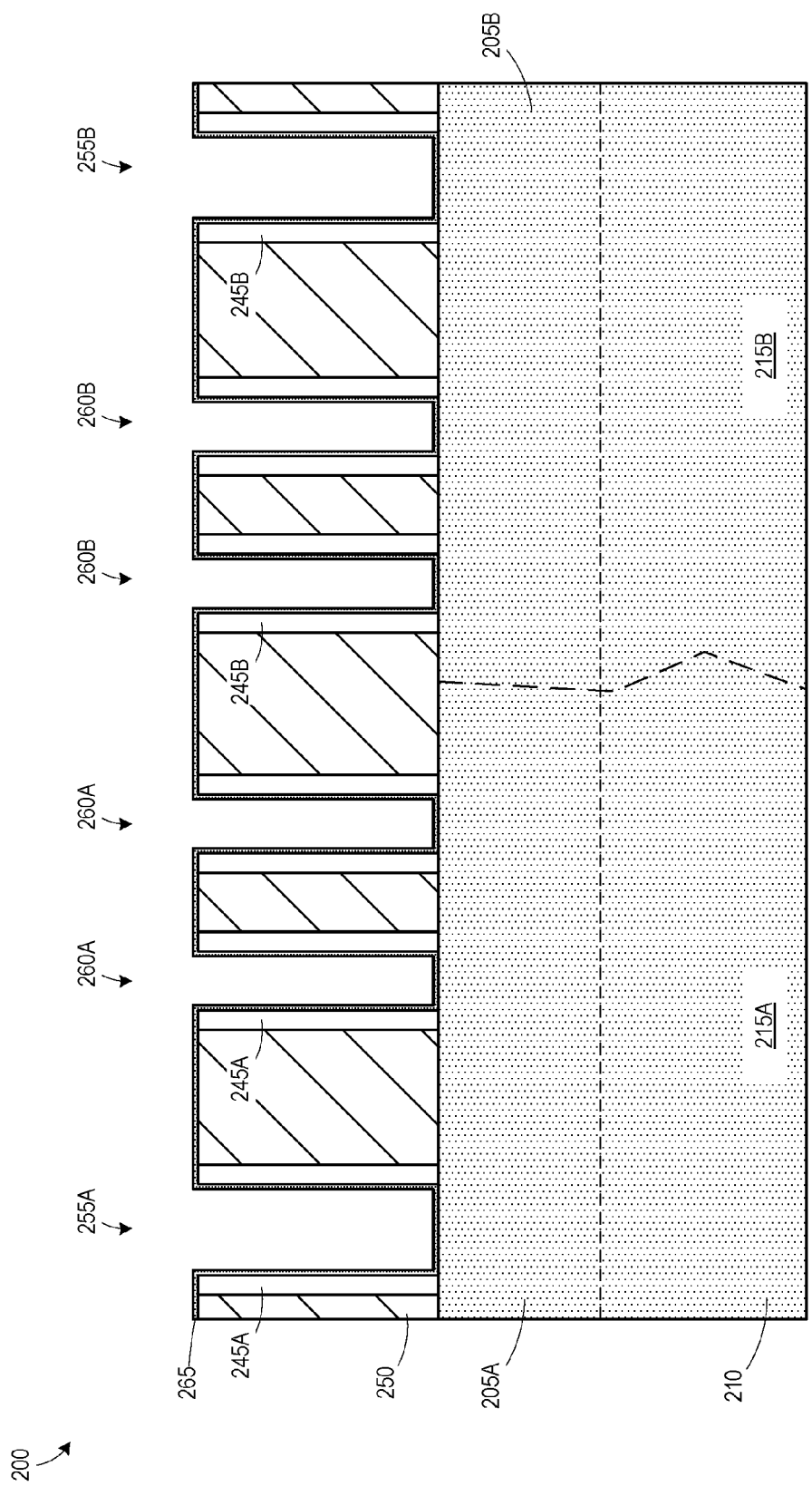
Figure 2E:
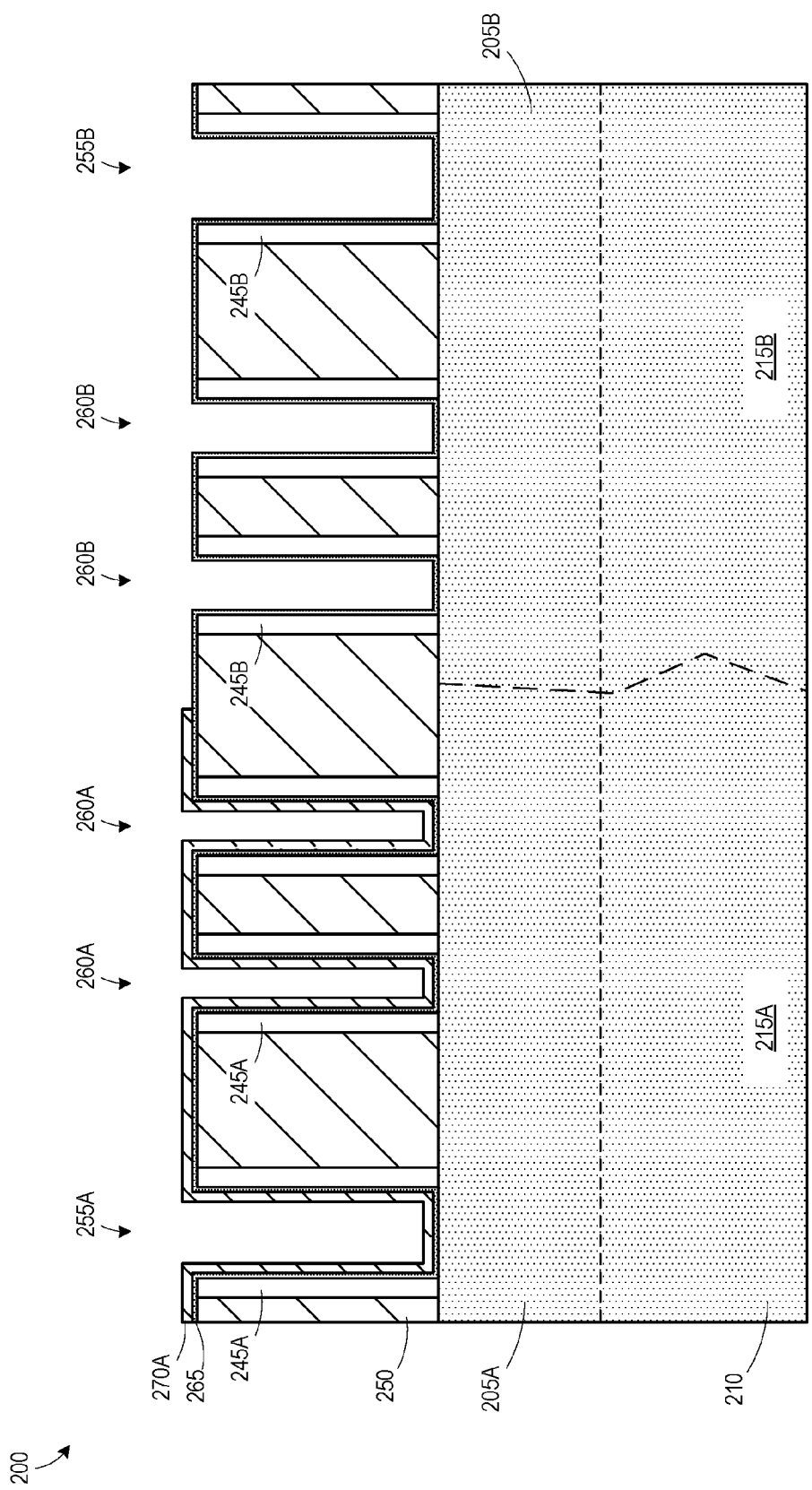
Figure 2F:
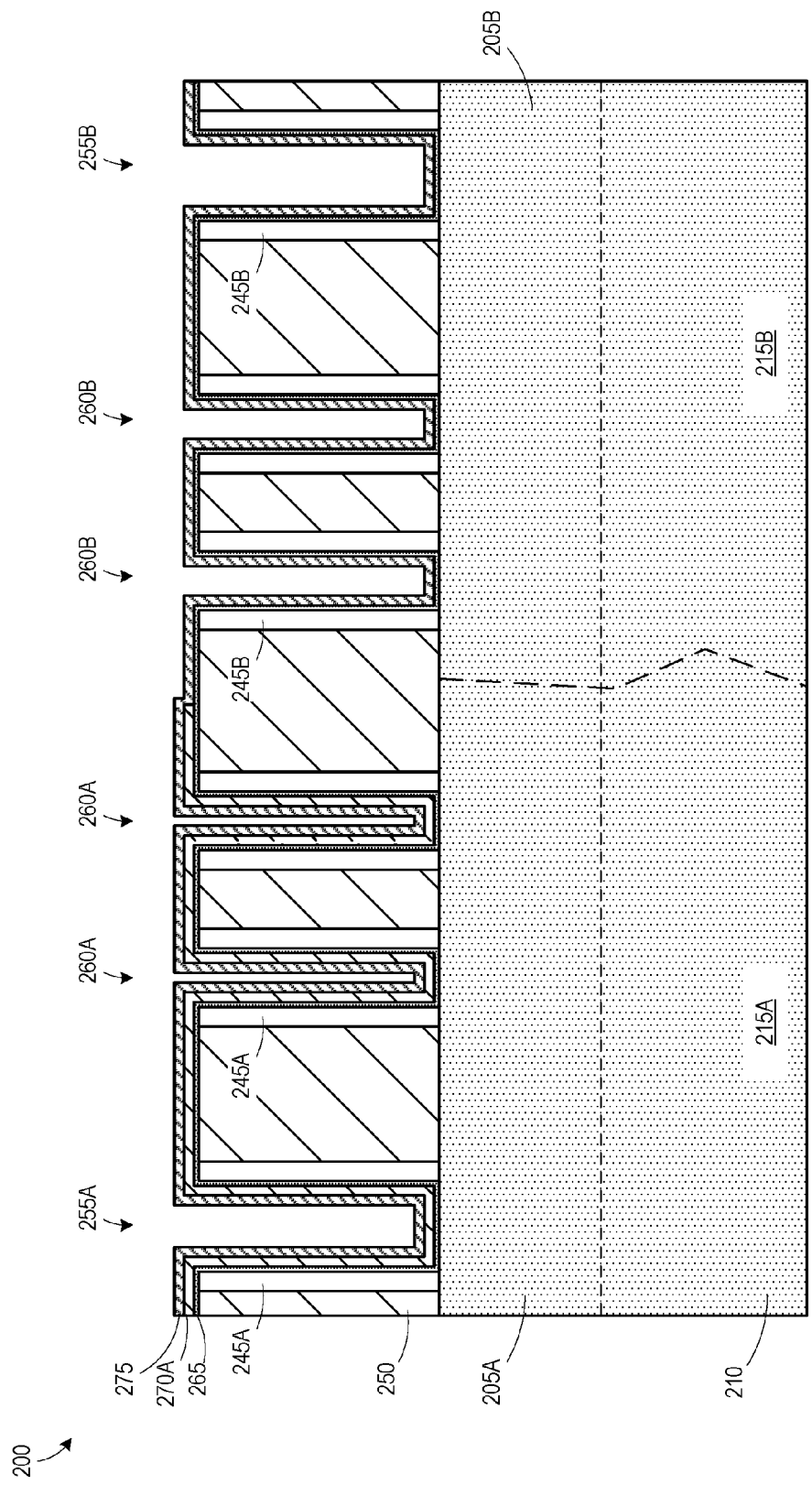
Figure 2G:
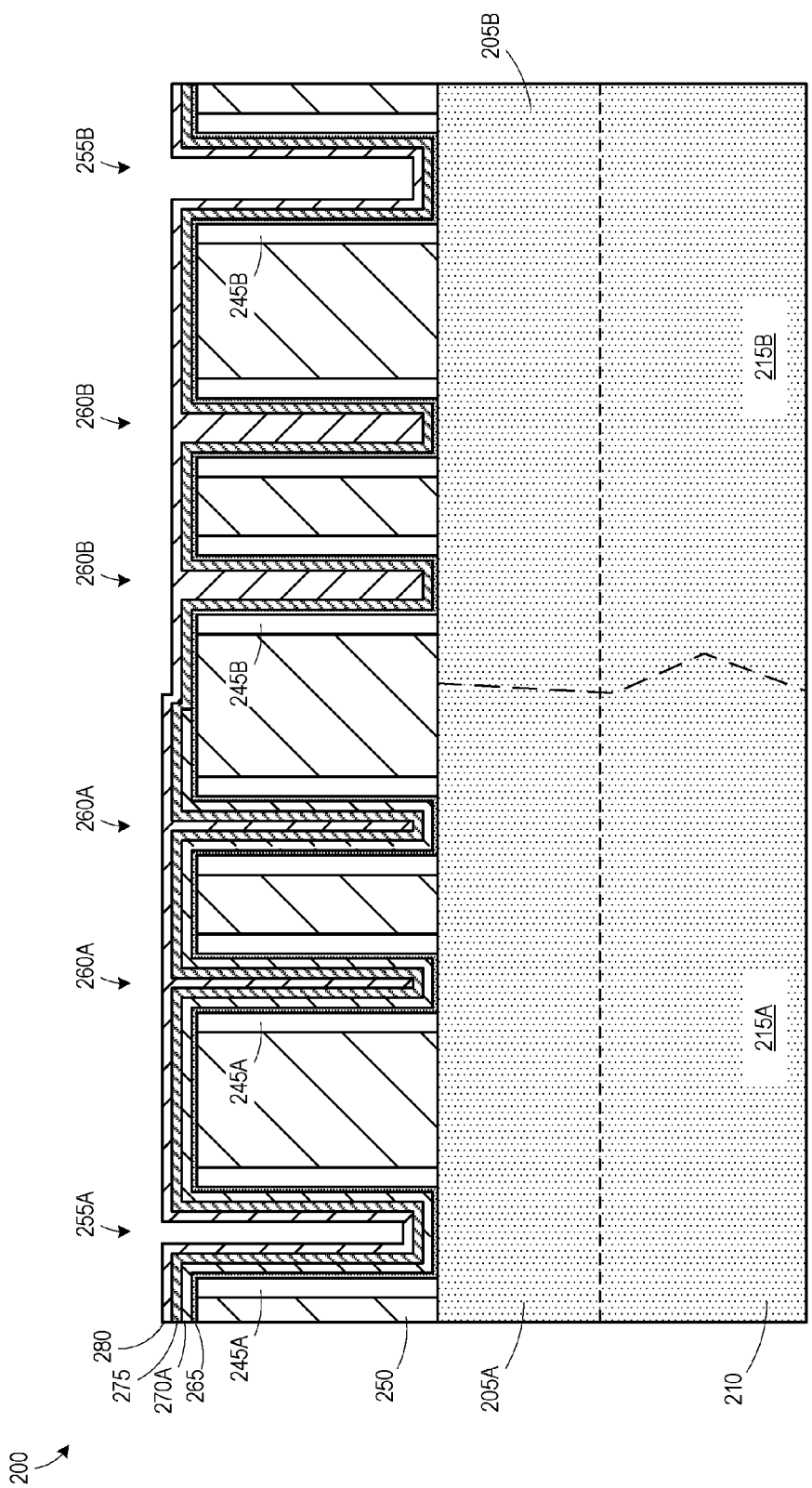
Figure 2H:
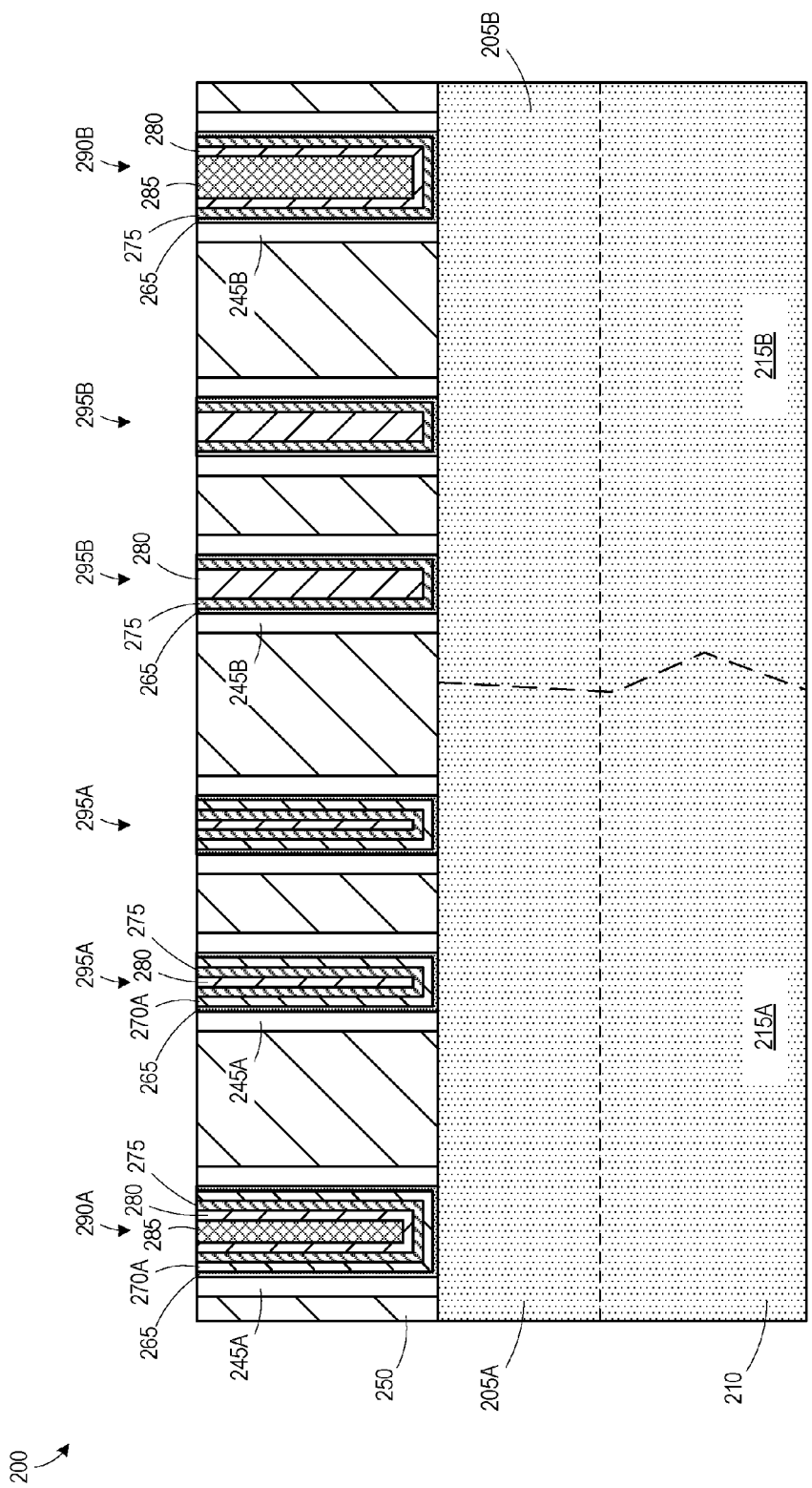
Figure 2I:
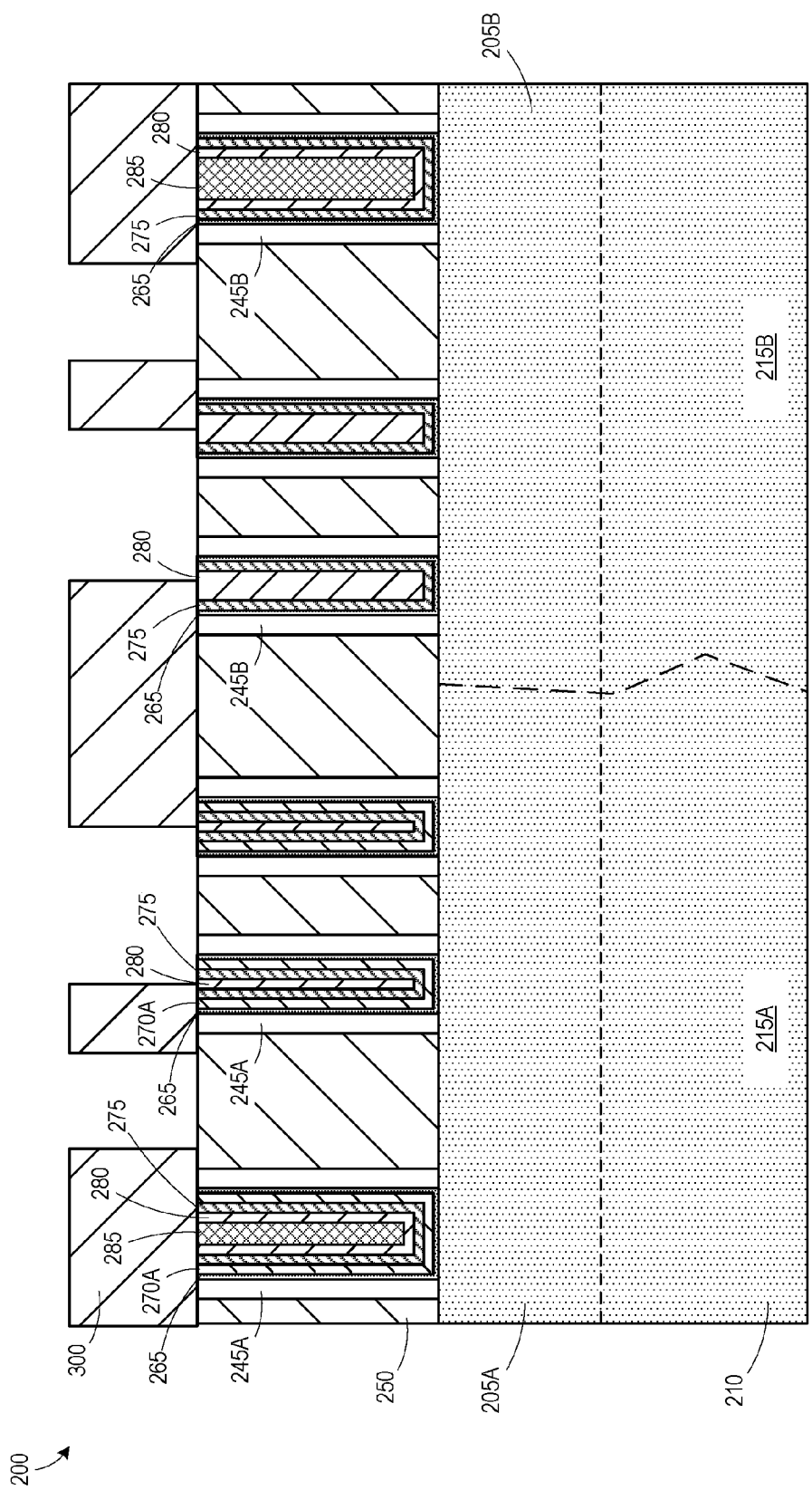
Figure 2J:
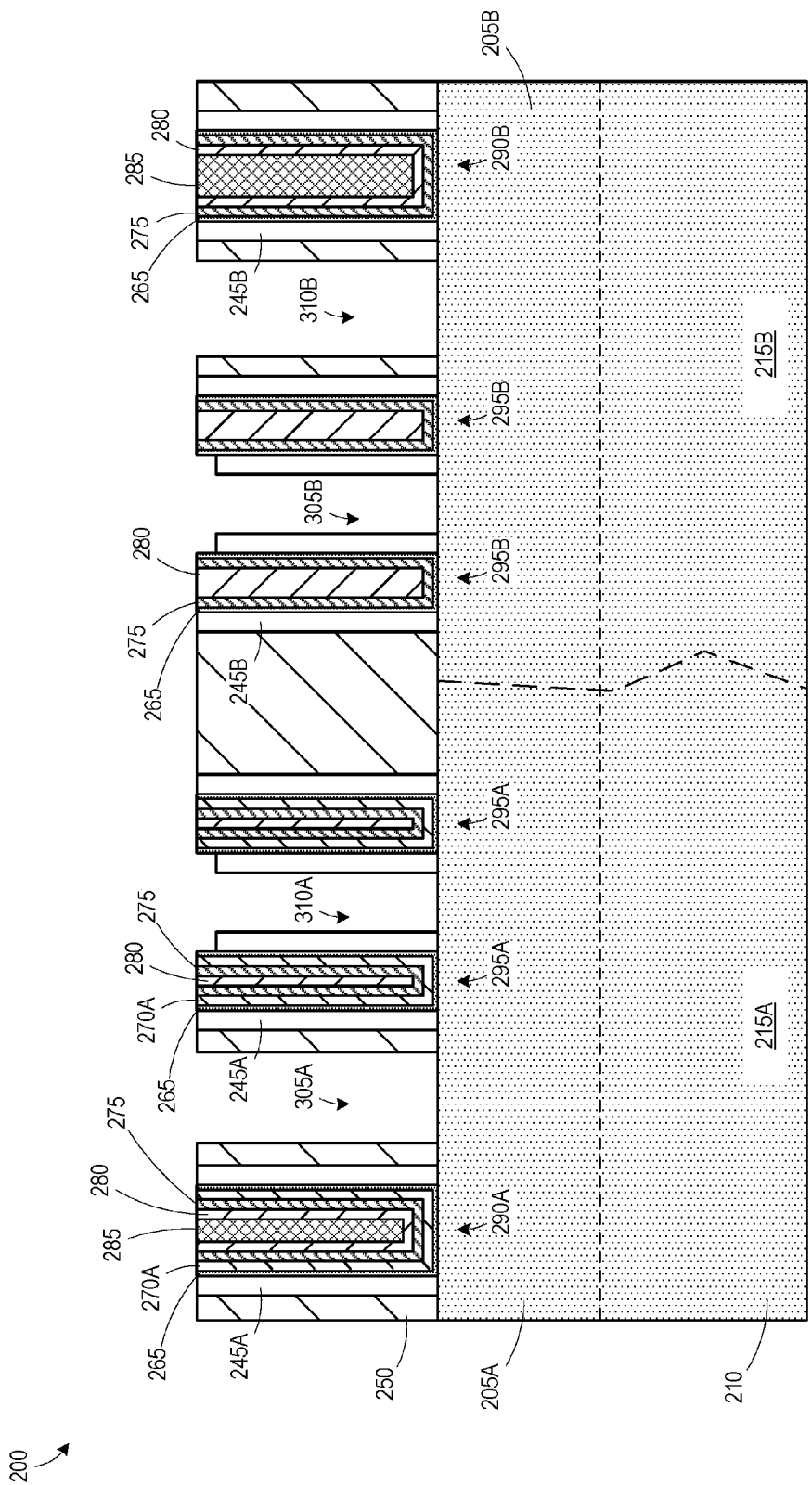
Figure 2K:
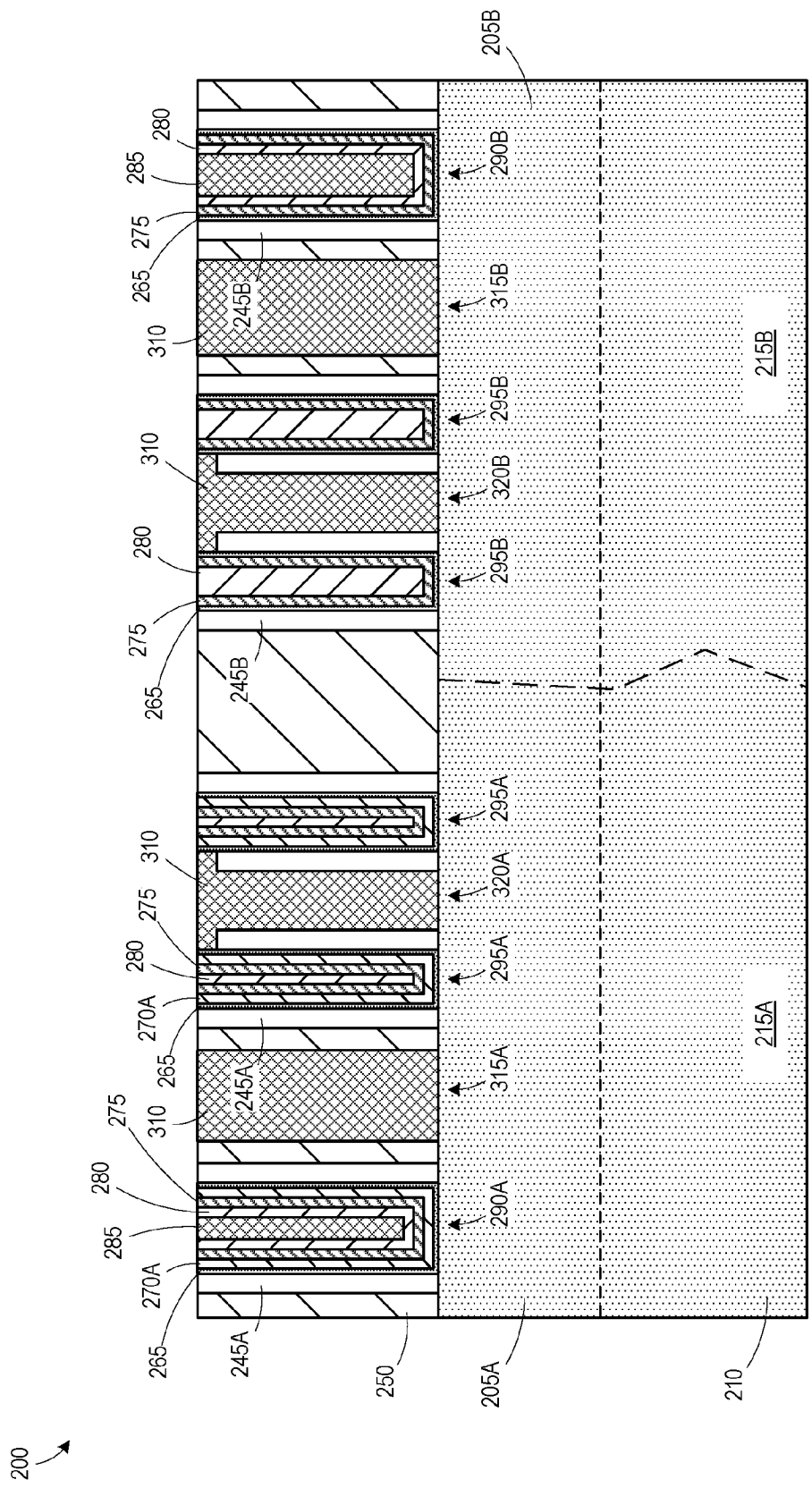
Figure 2L:
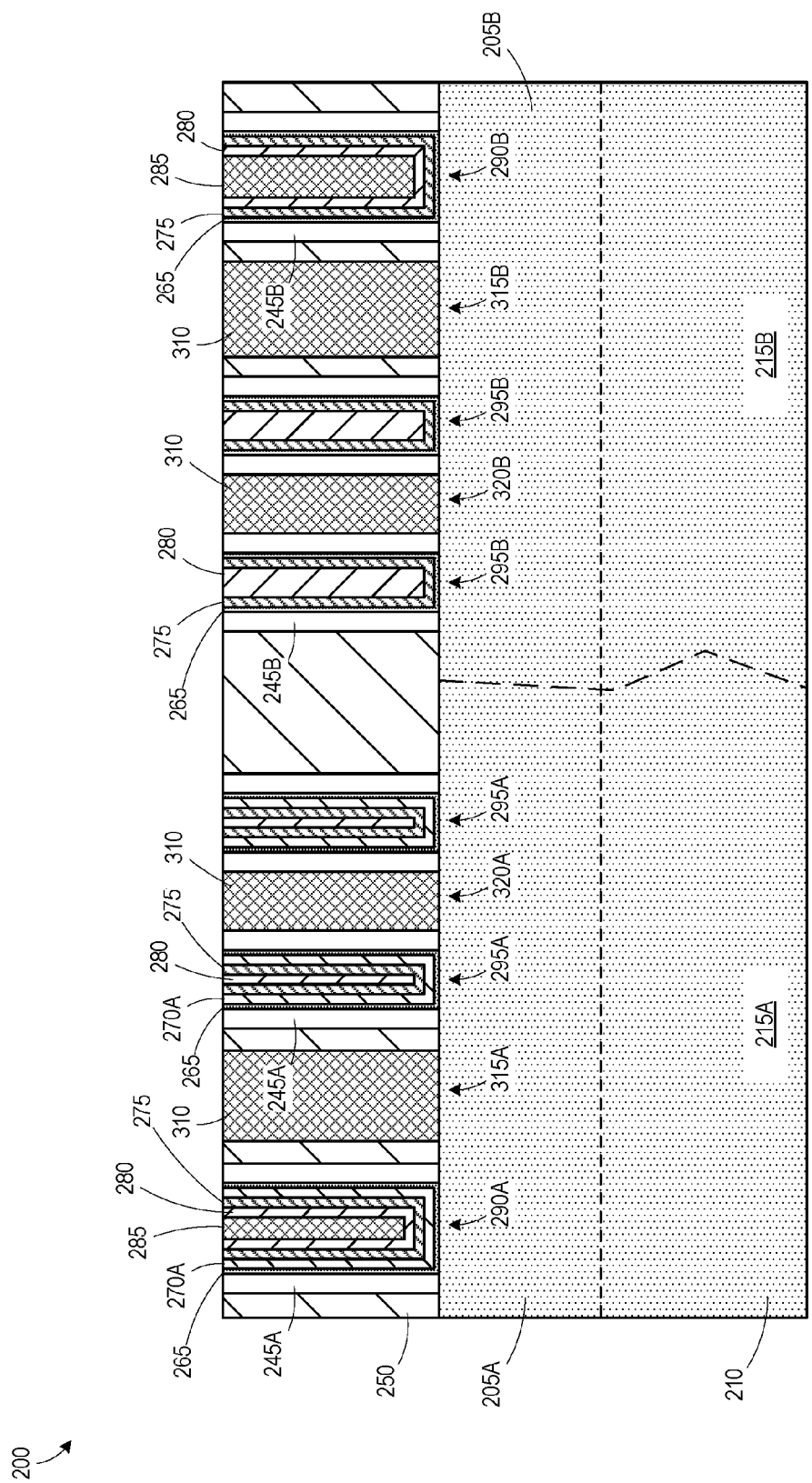
Figure 2M:
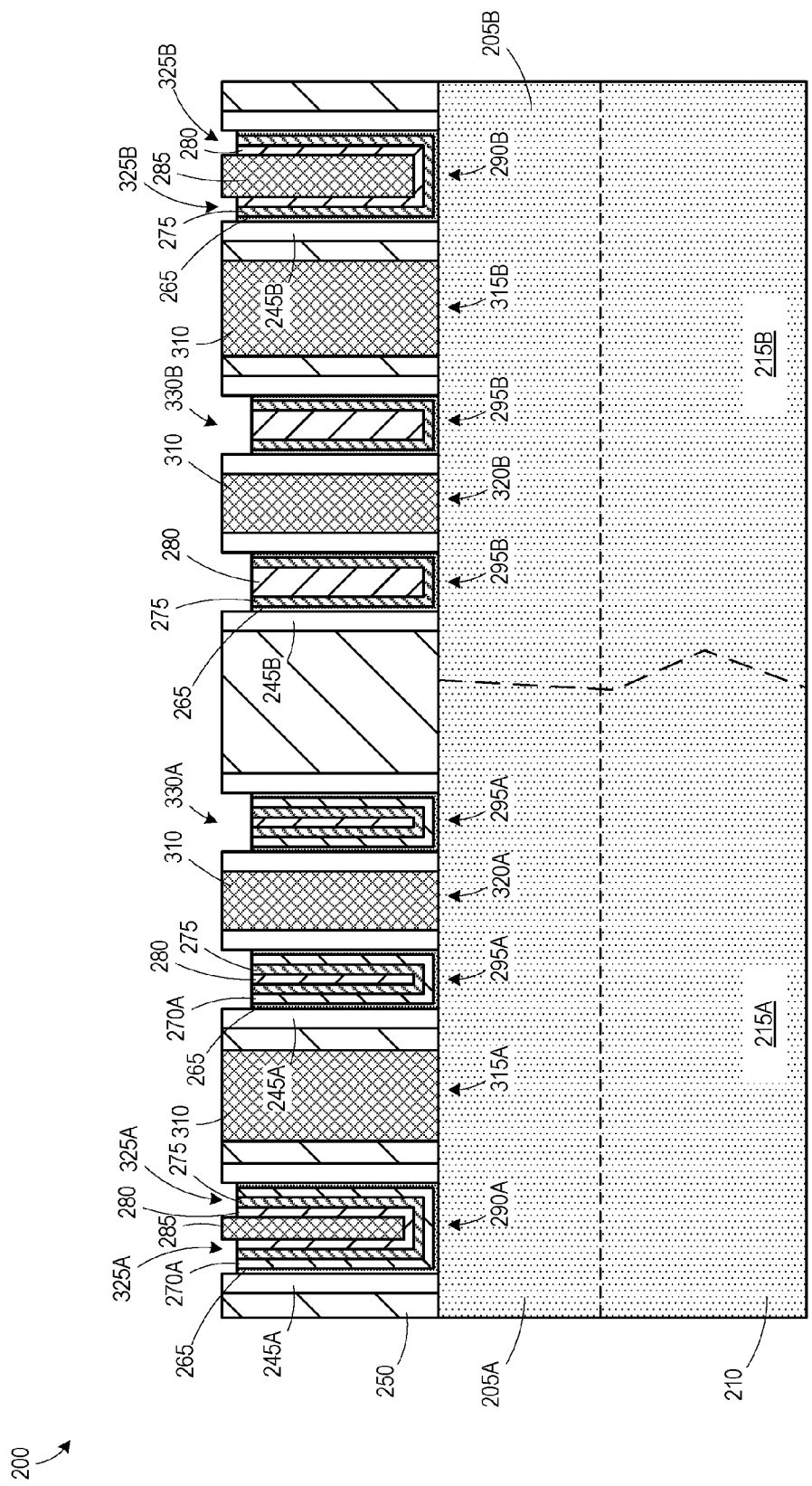
Figure 2N:
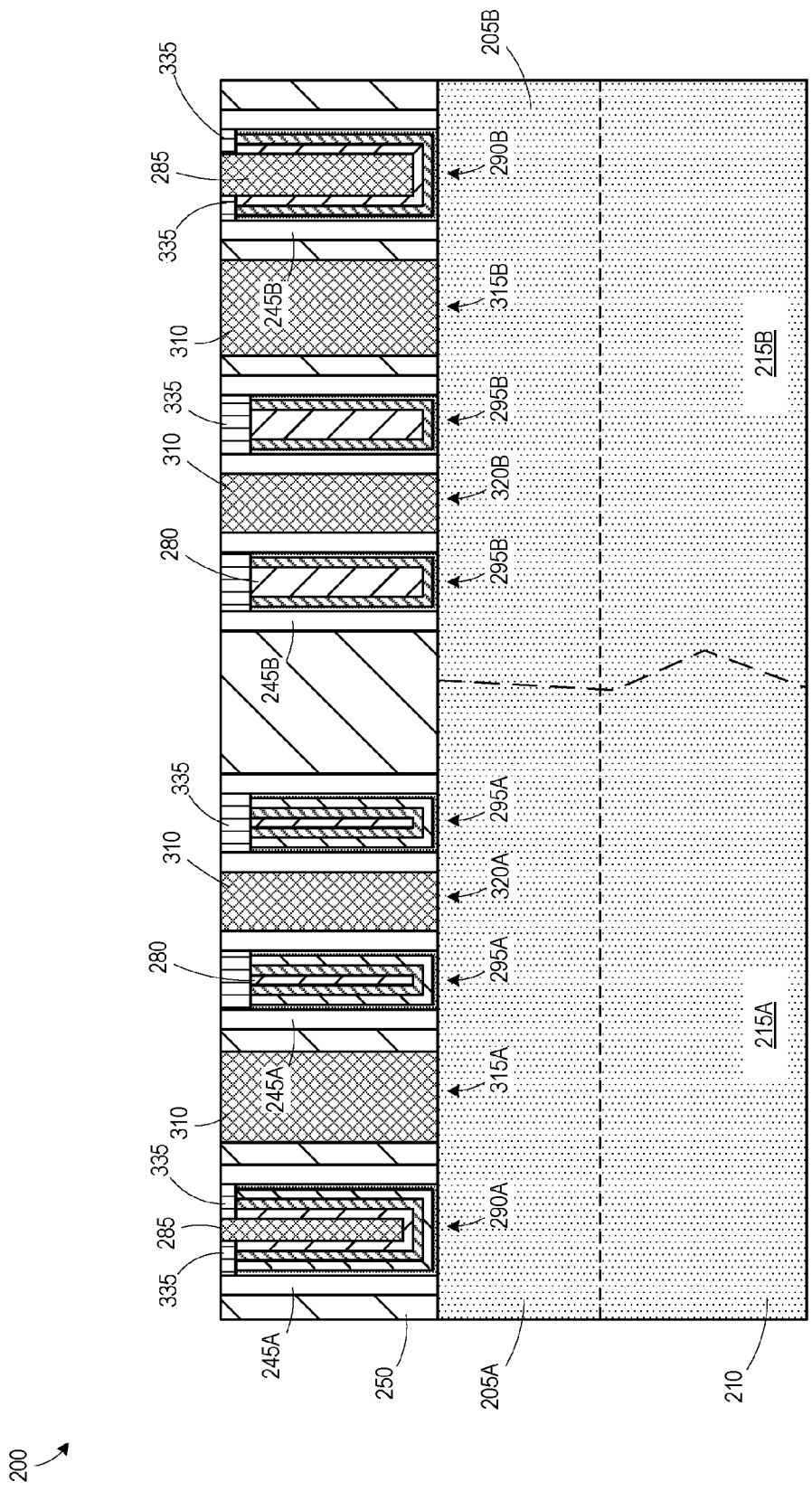
Figure 2O:
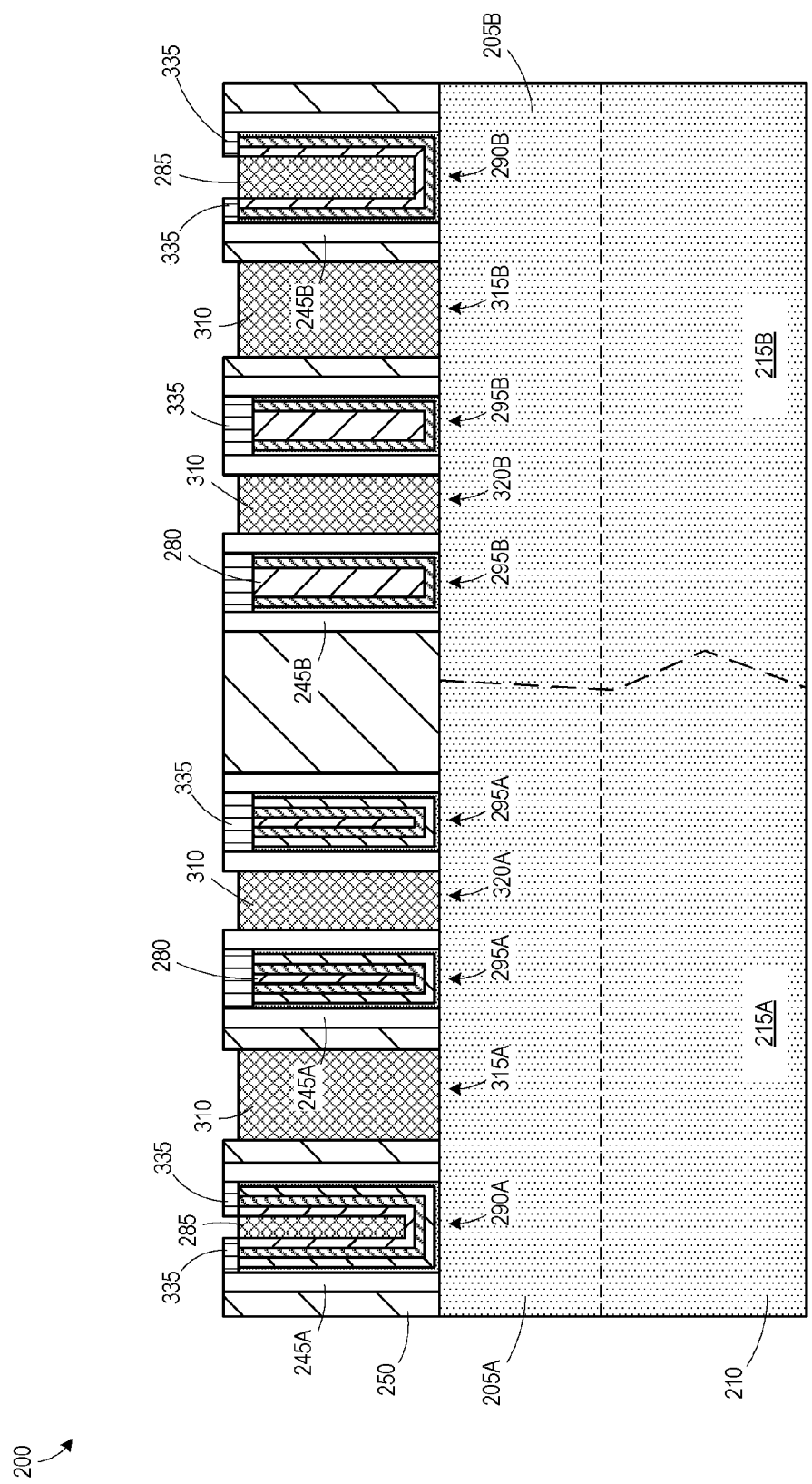
Figure 2P:
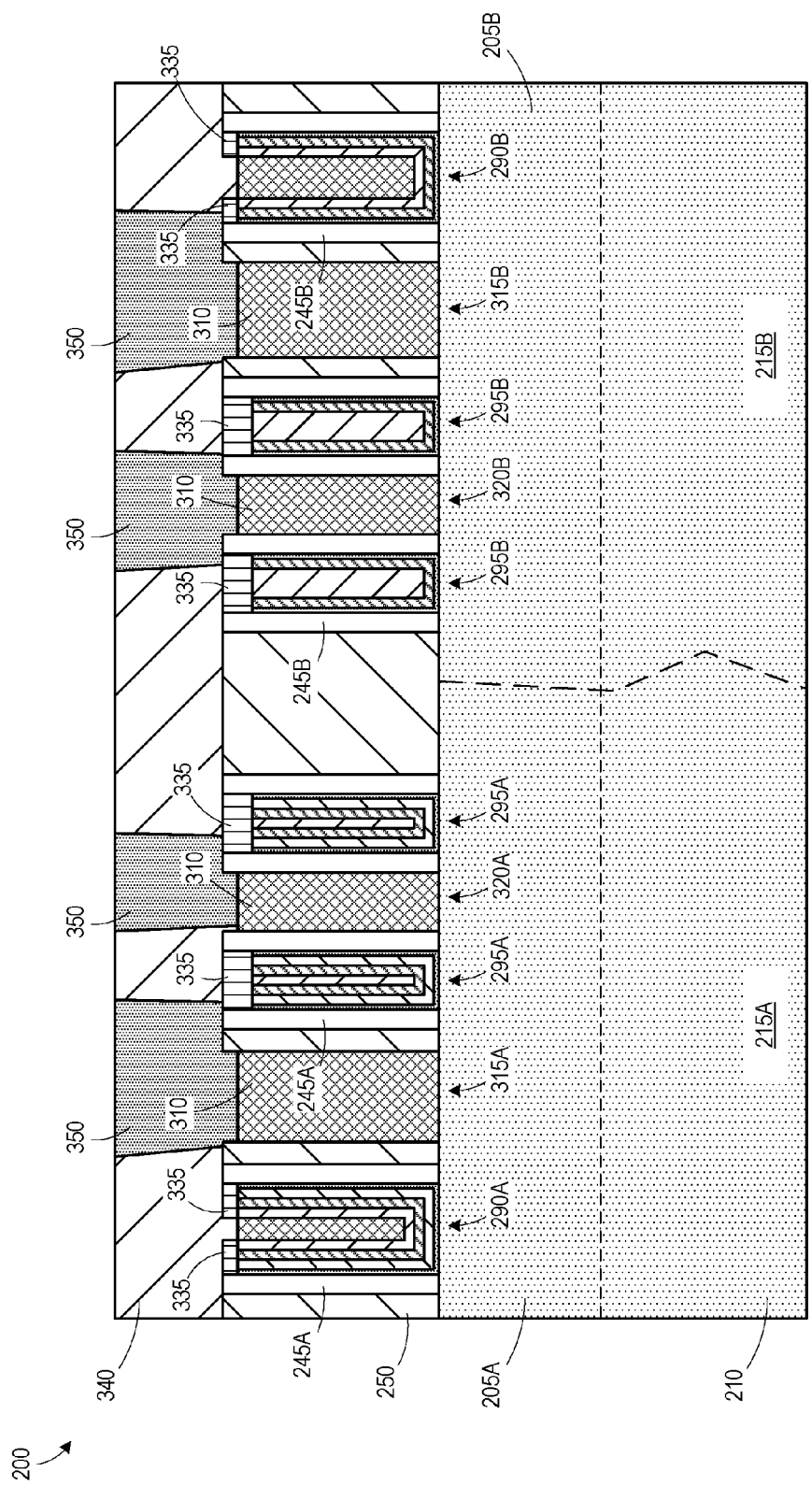

FIGS. 2A-2P illustrate various illustrative methods disclosed herein for forming an integrated circuit product 200. In the illustrated embodiment, the product includes finFET transistor devices, but the techniques described herein are not so limited, and they may be applied to other types of devices, such as planar devices. FIGS. 2A-2P show a cross-sectional view of the product 200 taken through the long axis of one of a first fin 205A formed in a substrate 210 in a first device region 215A (e.g., a PFET region) and a second fin 205B formed in the substrate 210 in a second device region 215B (e.g., an NFET region). The cross-sectional view is taken in a direction corresponding to the gate length direction of the product 200. In some cases, the fins 205A, 205B may be portions of the same originally formed fin that extend across both of the device regions 215A, 215B. In other cases, the fins 205A, 205B may each be a part of a different originally formed fin. An epitaxial growth process may be performed to provide different materials for the fins 205A, 205B. For example, the fin 205A may include boron doped SiGe (e.g., for a PFET), and the fin 205B may include phosphorus doped Si (e.g., for an NFET).

In one illustrative embodiment, a replacement gate technique is used to form devices in the product 200. Placeholder gate structures 220A, 225A, 220B, 225B are formed above the fins 205A, 205B, respectively, prior to the formation of a replacement gate structure. The gate structures 220A, 220B have a first gate length (i.e., long channel), and the gate structures 225A, 225B have a second, smaller gate length (i.e., short channel). The placeholder gate structures 220A, 220B each include a sacrificial placeholder material 230A, 230B, such as polysilicon, and a gate insulation layer (not separately shown), such as silicon dioxide. Similarly, the placeholder gate structures 225A, 225B each include a sacrificial placeholder material 235A, 235B and a gate insulation layer (not separately shown). Also depicted are illustrative gate hard mask layers 240A, 240B and sidewall spacers 245A, 245B, both of which may be made of a material such as silicon nitride. The size and materials of construction for the placeholder gates structures may be the same or different in the different device regions 215A, 215B.

The transistor devices formed in the product 200 depicted herein may be either NMOS or PMOS transistors, or a combination of both. Additionally, various doped regions, e.g., halo implant regions, well regions and the like, may be formed, but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205A, 205B may be formed in a process layer formed above the base layer of the substrate 210.

FIG. 2B illustrates the product 200 after a dielectric layer 250 was formed above the fins 205A, 205B and the placeholder gate structures 220A, 220B and planarized to remove the gate hard mask layers 240A, 240B and expose top surfaces of the sacrificial placeholder material 230A, 235A, 230B, 235B. In the illustrated embodiment, the dielectric layer 250 may be silicon dioxide, a low-k dielectric material having a dielectric constant of approximately 3.0 or lower or an ultra-low-k (ULK) material having a dielectric constant of approximately 2.5 or lower.

FIG. 2C illustrates the product 200 after a plurality of etch processes were performed to remove the sacrificial placeholder material 230A, 235A, 230B, 235B and any underlying gate dielectric layer, thereby defining gate cavities 255A, 260A, 255B, 260B.

FIG. 2D illustrates the product 200 after a deposition process was performed to form a gate dielectric layer 265 in the gate cavities 255A, 260A, 255B, 260B. In the illustrated embodiment, the gate dielectric layer 265 is comprised of a doped high-k (k greater than 10) insulation material (where k is the relative dielectric constant), such as hafnium oxide, doped with yttrium (Y) or lanthanum (L), for example. The doping of the gate dielectric layer 265 decreases the overall work function of the subsequently formed gate electrode structure, which affects the threshold voltage of the completed transistor devices, as described in greater detail below.

FIG. 2E illustrates the product 200 after a plurality of processes were performed to selectively form a first work function material layer 270A in the gate cavities 255A, 260A. In one embodiment, the work function material layer 270A was deposited over both regions, 215A, 215B. The region 215A was covered by a patterned mask (e.g., photoresist), and the portion of the work function material layer 270A in the region 215B was removed (e.g., by etching). In the illustrated embodiment, the work function material layer 270A is TiN.

FIG. 2F illustrates the product 200 after a conformal deposition process was performed to form a second work function material layer 275 above both regions 215A, 215B and in the gate cavities 255A, 260A, 255B, 260B. In the illustrated embodiment, the second work function material layer 275 is comprised of a stack of layers including, for example, TiN/TiC/TiN (the individual layers are not separately depicted in the drawings). In other embodiments, the stack of layers may include other material between the TiN layers, such as titanium aluminum carbide, titanium aluminum, or tantalum silicide.

FIG. 2G illustrates the product 200 after a conformal deposition process was performed to form a third work function material layer 280 (e.g., TiN or TiAl) in the gate cavities 255A, 260A, 255B, 260B. The third work function material layer 280 pinches off the short channel gate cavities 260A, 260B.

FIG. 2H illustrates the product 200 after a plurality of processes were performed. A deposition process was performed to fill the long channel gate cavities 255A, 255B with a conductive material 285 (e.g., tungsten, cobalt, aluminum, etc.) to define replacement gate structures 290A, 290B, 295A, 295B. Subsequently, a planarization process was performed to remove excess portions of the conductive material 285 and excess amounts of the other layers 265, 270A, 275, 280 above the upper surface of the dielectric layer 250.

FIG. 2I illustrates the product 200 after a patterned mask layer 300 was formed above the dielectric layer 250. In some embodiments, the patterned mask layer 300 may include a stack of layers such as a hard mask layer (e.g., amorphous carbon), an anti-reflective coating (ARC) layer, and a photoresist layer (i.e., from bottom to top).

FIG. 2J illustrates the product 200 after an etch process was performed to define contact openings 305A, 305B, 310A, 310B in the dielectric layer 250. Note that the widths of the contact openings 305A, 305B are defined by the patterned mask layer 300, and the widths of the contact openings 310A, 310B are self-aligned based on the distance between the spacers 245A, 245B, respectively. The etch process was highly selective to the metals in the layers 270A, 280, 285, however, some erosion of the spacers 245A, 245B may occur.

FIG. 2K illustrates the product 200 after a plurality of processes were performed to define contacts 315A, 315B, 320A, 320B. A strip process was performed to remove the patterned mask layer 300. One or more deposition processes were performed to form a conductive material 310 in the contact openings 305A, 305B, 310A, 310B. The contacts 315A, 315B, 320A, 320B may include multiple layers (not separately shown), such as a refractory metal liner (which may differ across the regions 215A, 215B), a silicide region at the interface with the fins 205A, 205B formed by reacting the refractory metal liner with the silicon in the fins 205A, 205B, a TiN liner formed above the refractory metal liner and the silicide, and a conductive fill material (e.g., tungsten, cobalt, aluminum, etc.). A planarizing process was performed to remove portions of the conductive material 310 above the dielectric layer 250.

FIG. 2L illustrates the product 200 after the planarizing process was continued (e.g., overpolishing) to account for the erosion of the spacers 245A, 245B.

FIG. 2M illustrates the product 200 after an etch process was performed to recess the work function material layers 270A, 275, 280 in the replacement gate structures 290A, 290B, 295A, 295B selectively to the conductive material 285, 310 to define cap recesses 325A, 325B, 330A, 330B. Due to the different aspect ratios, the cap recesses 330A, 330B are deeper than the cap recesses 325A, 325B. The recess etch also recesses the gate dielectric layer 265, but is selective to the material of the spacers 245A, 245B and the dielectric layer 250. In one embodiment, the etch process may be implemented using a $Cl_2/BCl_3$ chemistry.

FIG. 2N illustrates the product 200 after a plurality of processes were performed. A deposition process was performed to form a cap layer 335 in the cap recesses 325A, 325B, 330A, 330B and above the dielectric layer 250. A planarization process was performed to remove portions of the cap layer 335 disposed above the dielectric layer 250.

FIG. 2O illustrates the product 200 after an optional etch process was performed to recess the conductive material 285, 310. In some embodiments, the recessing may not be performed.

FIG. 2P illustrates the product 200 after a plurality of processes were performed. A deposition process was performed to form a dielectric layer 340 above the dielectric layer 250. A patterning process was performed to define contact openings in the dielectric layer 340. One or more deposition processes were performed to fill the contact recesses with a conductive material to define contacts 350 interfacing with the contacts 315A, 315B, 320A, 320B. The contacts 350 may comprise copper and one or more barrier layers (not separately shown) formed between the copper and the dielectric layer 250. In a different region of the product, additional contacts (not shown) may be formed to connect to the replacement gate structures 290A, 290B, 295A, 295B.

The cap layer 335 provides separation between the contacts 350 and the replacement gate structures 290A, 290B, 295A, 295B. Due to the selective recessing of the work function material layers 270A, 275, 280, the formation of the cap layer 335 is self-aligned. Hence, the likelihood of forming a contact-to-gate short is significantly reduced, even if there is a degree of misalignment between the contacts 350 and the contacts 315A, 315B, 320A, 320B.

Figure 3A:
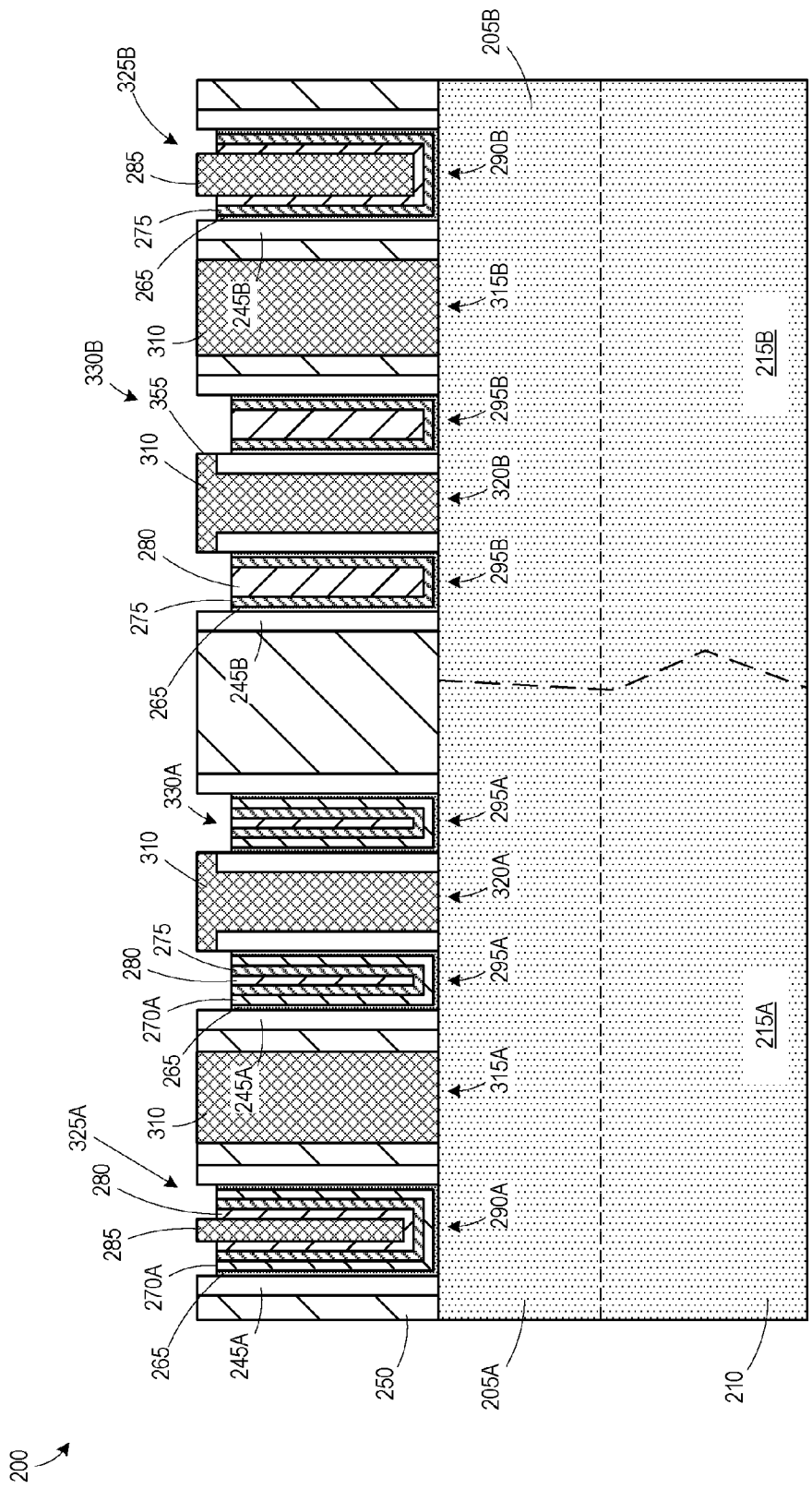
FIGS. 3A-3C depict an alternative process flow for forming self-aligned contact (SAC) structures on semiconductor devices and the resulting semiconductor devices.
Figure 3B:
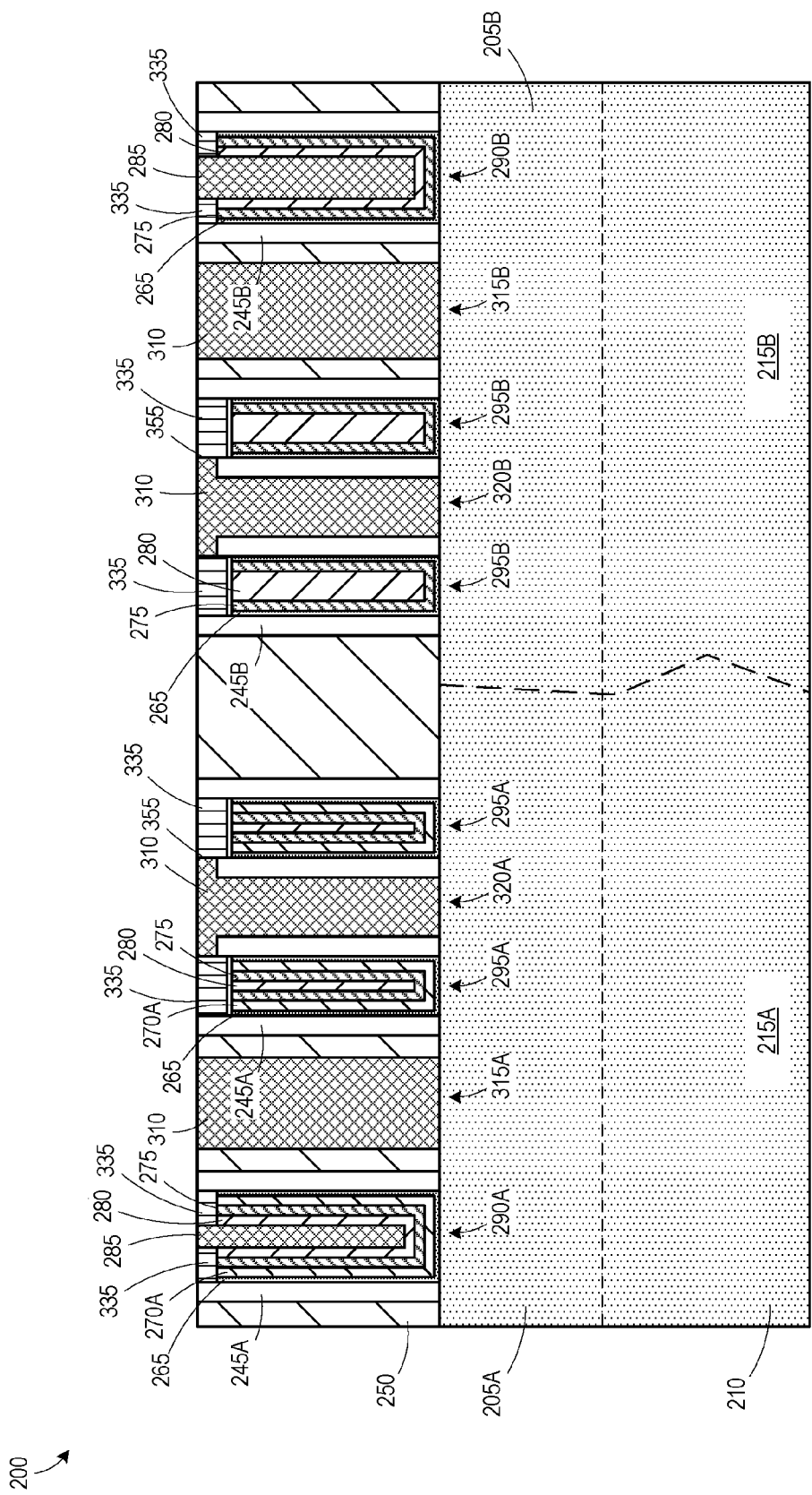
Figure 3C:
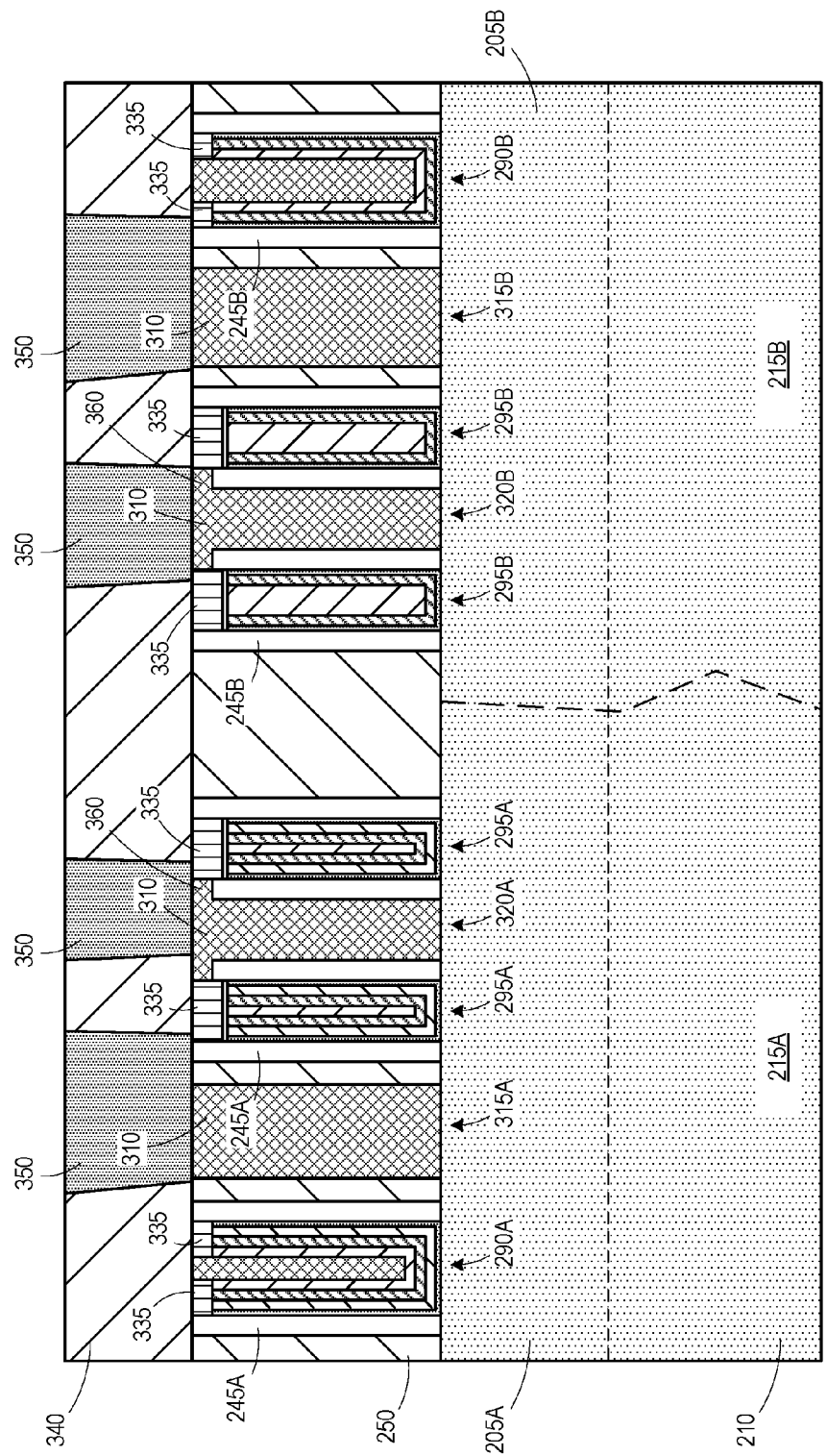

FIGS. 3A-3C illustrate an alternative process flow for forming self-aligned contact structures where the overpolishing of FIG. 2L is not performed. FIG. 3A illustrates the product 200 illustrated in FIG. 2K after an etch process was performed to recess the work function material layers 270A, 275, 280 in the replacement gate structures 290A, 290B, 295A, 295B selectively to the conductive material 285, 310 to define the cap recesses 325A, 325B, 330A, 330B. If a liner (not separately) shown), such as TiN is provided in the contacts 315A, 315B, 320A, 320B, it is also recessed exposing the sidewalls 355 of the conductive fill material. The depth of the recessing is selected such that the cap recesses 325A, 325B, 330A, 330B extend to a depth greater than the recessing of the spacers 245A, 245B to avoid overlap between the work function material layers 270A, 275, 280 and the conductive material 310.

FIG. 3B illustrates the product 200 of FIG. 3A after a plurality of processes were performed. A deposition process was performed to form a cap layer 335 in the cap recesses 325A, 325B, 330A, 330B and above the dielectric layer 250. A planarization process was performed to remove portions of the cap layer 335 disposed above the dielectric layer 250.

FIG. 3C illustrates the product 200 of FIG. 3B after a plurality of processes were performed. A deposition process was performed to form a dielectric layer 340 above the dielectric layer 250. A patterning process was performed to define contact openings in the dielectric layer 340. One or more deposition processes were performed to fill the contact recesses with a conductive material to define contacts 350 interfacing with the contacts 315A, 315B, 320A, 320B. The contacts 350 may comprise copper and one or more barrier layers (not separately shown) formed between the copper and the dielectric layer 250. In a different region of the product, additional contacts (not shown) may be formed to connect to the replacement gate structures 290A, 290B, 295A, 295B. The wider top portions 360 of the contacts 320A, 320B provide additional overlay margin with the contacts 350.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first plurality of gate cavities in a first dielectric layer;
    forming a work function material layer in said first plurality of gate cavities;
    forming a first conductive material in at least a subset of said first plurality of gate cavities above said work function material layer to define a first plurality of gate structures;
    forming a first contact recess in said first dielectric layer between two of said first plurality of gate structures;
    forming a second conductive material in said first contact recess;
    recessing said work function material layer selectively to said first and second conductive materials to define a plurality of cap recesses in said subset of said first plurality of gate cavities adjacent first and second upper surfaces of said first and second conductive materials, respectively; and
    forming a cap layer comprising dielectric material in said plurality of cap recesses.

2. The method of claim 1, wherein forming said first plurality of gate cavities comprises:
    forming a plurality of placeholder gate structures;
    forming spacers adjacent said placeholder gate structures;
    forming said first dielectric layer above said placeholder gate structures;
    planarizing said first dielectric layer to expose said placeholder gate structures; and
    removing said placeholder gate structures to define said first plurality of gate cavities.

3. The method of claim 1, wherein forming said first contact recess in said first dielectric layer between two of said first plurality of gate structures comprises:
    performing a self-aligned etch process to remove a portion of said first dielectric layer positioned between a first sidewall spacer of a first gate structure of said first plurality of gate structures and a second sidewall spacer of a second gate structure of said first plurality of gate structures.

4. The method of claim 1, wherein said first plurality of gate cavities are each formed between a pair of spacers, at least some of said spacers having a first top surface lower than a second top surface of said first dielectric layer, and the method further comprises planarizing said first dielectric layer, said pairs of spacers, said first conductive material, said second conductive material, and said work function material layer, so as to provide said first dielectric layer with a height less than a previous height of said first top surface prior to said planarizing.

5. The method of claim 1, wherein said first plurality of gate cavities are each formed between a pair of spacers, said spacers having a first top surface lower than a second top surface of said first dielectric layer, and forming said second conductive material comprises forming a portion of said second conductive material above said top surface of said spacers to define a top portion of said second conductive material having an increased width as compared to a bottom portion of said conductive material.

6. The method of claim 1, wherein said first plurality of gate cavities includes a first gate cavity having a first width and a second gate cavity having a second width less than said first width, forming said work function material layer comprises filling said second gate cavity with said work function material layer, and forming said first conductive material comprises forming said first conductive material in said first gate cavity.

7. The method of claim 1, further comprising planarizing said cap layer to remove portions extending above said first dielectric layer.

8. The method of claim 3, wherein performing said self-aligned etch process comprises forming a mask layer above said first dielectric layer, said mask layer having an opening having a first edge positioned above said first gate structure and a second edge positioned above said second gate structure to expose said portion of said first dielectric layer.

9. The method of claim 4, further comprising:
    forming a second dielectric layer above said first dielectric layer;
    forming a contact opening in said second dielectric layer exposing a portion of said second upper surface of said second conductive material; and
    forming a third conductive material in said contact opening.

10. The method of claim 5, further comprising:
    forming a second dielectric layer above said first dielectric layer;
    forming a contact opening in said second dielectric layer exposing said second upper surface of said second conductive material; and
    forming a third conductive material in said contact opening.

11. The method of claim 9, further comprising recessing said first and second conductive materials after forming said cap layer and prior to forming said second dielectric layer.

12. A method, comprising:
    forming a plurality of placeholder gate structures including a first placeholder gate structure having a first width, and a second placeholder gate structure having a second width less than said first width;
    forming spacers adjacent said plurality of placeholder gate structures;
    forming a first dielectric layer above said plurality of placeholder gate structures;
    planarizing said first dielectric layer to expose said plurality of placeholder gate structures;
    removing said first and second placeholder gate structures to define a plurality of gate cavities including a first gate cavity defined by removing said first placeholder gate structure and a second gate cavity defined by removing said second placeholder gate structure;
    forming a work function material layer in said plurality of gate cavities, wherein said work function material layer fills said second gate cavity to define a first gate structure;
    forming a first conductive material in said first gate cavity above said work function material layer to substantially fill said first gate cavity to define a second gate structure;

forming a first contact recess in said first dielectric layer between said first and second gate structures;

forming a second conductive material in said first contact recess;

recessing said work function material layer in said first and second gate structures selectively to said first and second conductive materials to define a plurality of cap recesses in said first and second gate structures adjacent first and second upper surfaces of said first and second conductive materials, respectively; and forming a cap layer comprising dielectric material in said plurality of cap recesses.

13. The method of claim 12, wherein said plurality of placeholder gate structures includes a third placeholder gate structure having said second width, said work function material layer substantially fills said third gate cavity to define a third gate structure, and the method further comprises forming a second contact recess between said first and third gate structures using a self-aligned etch process.

14. The method of claim 12, wherein said spacers adjacent said second contact recess have a first top surface lower than a second top surface of said first dielectric layer, and the method further comprises planarizing said first dielectric layer, said spacers, said first conductive material, said second conductive material, and said work function material layer, so as to provide said first dielectric layer with a height less than a previous height of said first top surface prior to said planarizing.

15. The method of claim 12, wherein said spacers adjacent said second contact recess have a first top surface lower than a second top surface of said first dielectric layer, and forming said second conductive material comprises forming a portion of said second conductive material above said top surface of said spacers adjacent said second contact opening to define a top portion of said second conductive material having an increased width as compared to a bottom portion of said conductive material in said second contact recess.

16. The method of claim 13, wherein performing said self-aligned etch process comprises forming a mask layer above said first dielectric layer, said mask layer having an opening having a first edge positioned above said first gate structure and a second edge positioned above said third gate structure to expose said portion of said first dielectric layer.

17. The method of claim 14, further comprising:

forming a second dielectric layer above said first dielectric layer;

forming a first contact opening in said second dielectric layer exposing a portion of said second upper surface of said second conductive material in said first contact recess;

forming a second contact opening in said second dielectric layer exposing a top portion of said second upper surface of said second conductive material in said second contact recess; and forming a third conductive material in said first and second contact openings.

18. The method of claim 15, further comprising:

forming a second dielectric layer above said first dielectric layer;

forming a contact opening in said second dielectric layer exposing said top portion of said second conductive material having said increased width; and forming a third conductive material in said contact opening.

* * * * *